United States Patent
Heo et al.

(10) Patent No.: US 8,054,689 B2
(45) Date of Patent: Nov. 8, 2011

(54) MEMORY CARD USING MULTI-LEVEL SIGNALING AND MEMORY SYSTEM HAVING THE SAME

(75) Inventors: Seok-Won Heo, Seoul (KR); Min-Soo Kang, Suwon-si (KR); Chang-Duck Lee, Seoul (KR); Soong-Man Shin, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 228 days.

(21) Appl. No.: 12/487,381

(22) Filed: Jun. 18, 2009

(65) Prior Publication Data

US 2009/0316485 A1    Dec. 24, 2009

(30) Foreign Application Priority Data

Jun. 19, 2008  (KR) ................ 10-2008-0057973

(51) Int. Cl.
*G11C 11/34* (2006.01)

(52) U.S. Cl. ............ 365/185.18; 365/189.09; 365/185.2

(58) Field of Classification Search ............. 365/185.18, 365/189.09, 185.2, 189.11, 189.07, 185.03, 365/185.22, 189.16

See application file for complete search history.

(56) References Cited

U.S. PATENT DOCUMENTS

| 6,046,933 A | 4/2000 | Nobukata et al. |
| 2004/0047173 A1* | 3/2004 | Kang ............................ 365/145 |
| 2007/0147114 A1 | 6/2007 | Takeuchi |
| 2009/0103358 A1* | 4/2009 | Sommer et al. .......... 365/185.03 |
| 2009/0147570 A1* | 6/2009 | Cornwell et al. .......... 365/185.2 |

FOREIGN PATENT DOCUMENTS

| JP | 11-232886 A | 8/1999 |
| JP | 2004-319007 A | 11/2004 |

* cited by examiner

*Primary Examiner* — Dang Nguyen

(74) *Attorney, Agent, or Firm* — Sughrue Mion, PLLC

(57) ABSTRACT

A memory card including a memory controller, a memory system and a method to control a memory are provided. The memory card includes a flash memory, a memory interface outputting a writing data signal to be written into the flash memory, and a multi-level converter transforming the writing data signal into a writing voltage signal to be provided to the flash memory. The writing voltage signal has one of different voltage levels in accordance with plural bits of the writing data signal.

16 Claims, 10 Drawing Sheets

FIG. 2A

| Data Signal | Multi-Level Voltage Signal |
|---|---|
| 00 | 0V |
| 01 | 1.5V |
| 10 | 1.8V |
| 11 | 3.3V |

FIG. 2B

| Multi-Level Voltage Signal | Data Signal |
|---|---|
| 0V ~ 0.8V | 00 |
| 0.8V ~ 1.7V | 01 |
| 1.7V ~ 2.5V | 10 |
| 2.5V ~ 3.3V | 11 |

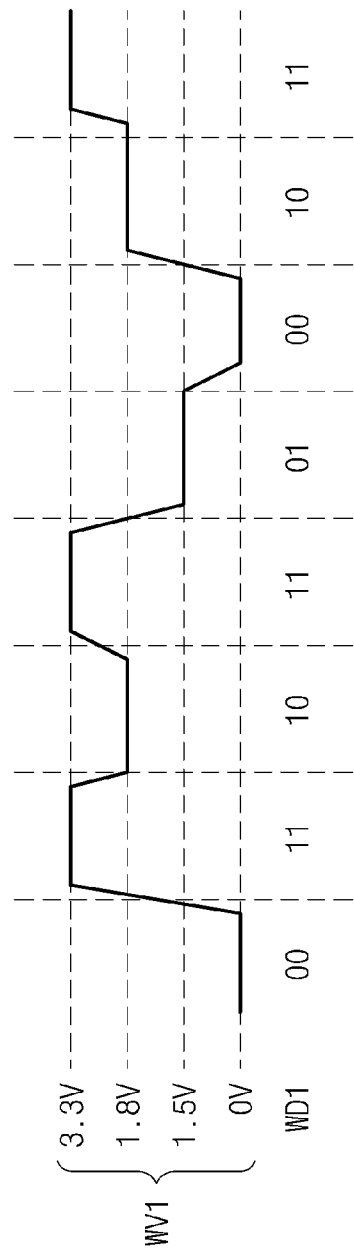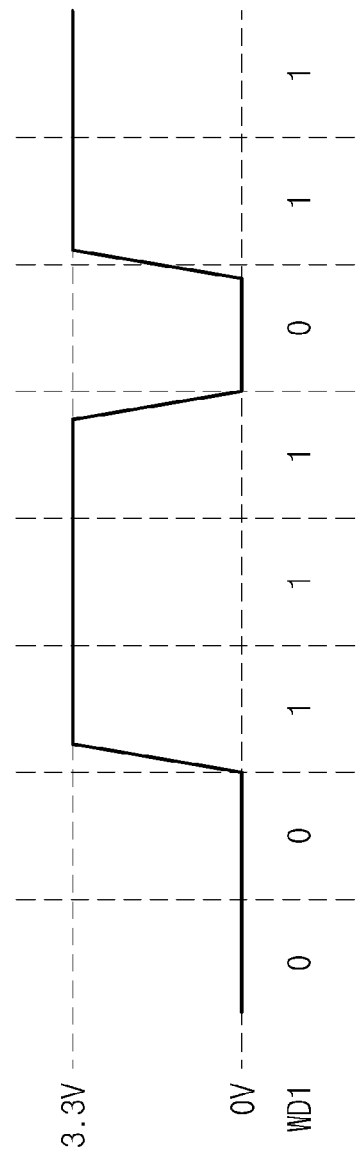

US 8,054,689 B2

MEMORY CARD USING MULTI-LEVEL SIGNALING AND MEMORY SYSTEM HAVING THE SAME

CROSS-REFERENCE TO RELATED APPLICATIONS

This application claims priority under 35 U.S.C. §119 of Korean Patent Application No. 10-2008-0057973 filed on Jun. 19, 2008, in the Korean Intellectual Property Office, the entire contents of which are incorporated herein by reference.

SUMMARY

The inventive concept disclosed herein relates to memory cards.

With the today's rapid advancement of information technology evolving toward a convergence of computation, communication, and broadcasting, there is a constant stream of high-tech electronic information apparatuses. In step with the rapid development of digital application techniques, various kinds of portable storage units are being commercialized. Such portable storage units are widely employed in digital camcorders, digital cameras, MP3 players, digital voice recorders, mobile phones, personal information assistants (PDA), and so on, which use memory devices or small hard disks as media for storing data. Among the media, mobile memory cards—which include multimedia cards (MMCs), secure digital (SD) cards, compact flash (CF) cards, universal serial bus (USB) flash disks, memory sticks, etc., are widely used and are easily removable, light, slim, simple, and small. The memory cards are sized as large as stamps and retain data stored therein even without a power supply. Further, they are becoming essential for information living because of large capacities even in small sizes.

A data transfer rate between a memory card and a host, such as a personal computer, a digital camcorder, a digital camera, an MP3 player, a digital voice recorder, a mobile phone, or a PDA, is an important factor involved in operation performance of a system including the memory card and the host.

Generally, a memory card includes a memory and a controller for an interface between a host and the memory device and controlling of reading/writing operations to the memory card. A data transfer rate between the memory and the controller is a matter of importance in determining the performance of the memory card.

The inventive concept provides a memory controller, a memory card including a memory and the memory controller, a memory system including a host and the memory card, and a method of controlling the flash memory, in which a data transfer rate among the host, the memory controller and the flash memory is increased. According to an aspect of the inventive concept, there is provided a memory card including: a flash memory; a memory interface outputting a writing data signal to be written into the flash memory; and a multi-level converter transforming the writing data signal into a writing voltage signal to be provided to the flash memory. The writing voltage signal is generated in different voltage levels in accordance with plural bits of the writing data signal.

According to another aspect of the inventive concept, there is provided a memory card including: a flash memory; a memory interface outputting a writing data signal to be written into the flash memory; a first multi-level converter transforming the writing data signal into a writing voltage signal to be provided to the flash memory; a host interface outputting a reading data signal to be transferred to a host; and a second multi-level converter transforming the reading data signal into a reading voltage signal to be provided to the host. The writing voltage signal varies in voltage level by plural bits of the writing data signal. The reading voltage signal varies in voltage level by plural bits of the reading data signal.

According to still another aspect of the inventive concept, there is provided a memory system including a host, and a memory card where the memory card includes: a flash memory; a memory interface outputting a writing data signal to be written into the flash memory; a first multi-level converter transforming the writing data signal into a writing voltage signal to be provided to the flash memory; a host interface outputting a reading data signal to be transferred to a host; and a second multi-level converter transforming the reading data signal into a reading voltage signal to be provided to the host. The writing voltage signal varies in voltage level by plural bits of the writing data signal and the reading voltage signal varies in voltage level by plural bits of the reading data signal.

With the memory card according to the inventive concept, a data transfer rate between the memory controller and the flash memory included in the memory card may be increased. Moreover, a data transfer rate between a host, to which the memory card is connected, and the memory card may also be increased.

A further understanding of the nature and other aspects of the inventive concept may be realized by reference to the remaining portions of the specification and the attached drawings.

BRIEF DESCRIPTION OF THE DRAWINGS

Non-limiting and non-exhaustive exemplary embodiments will be described with reference to the following drawings, in which:

FIG. 2A shows an example where data signals are converted into multi-level voltage signals by a multi-level converter of FIG. 1;

FIG. 2B shows an example where multi-level voltage signals are converted into data signals by a multi-level converter of FIG. 1;

FIG. 8A shows an example where a writing data signal is converted into a writing voltage signal by the multi-level converter of FIG. 3; and FIG. 8B shows an example where a writing data signal output from a memory interface in FIG. 3 is transferred directly to a flash memory without converting into a multi-level voltage signal.

DETAILED DESCRIPTION OF EXEMPLARY EMBODIMENTS

Hereinafter, exemplary embodiments are explained in conjunction with the accompanying drawings. The term "unit", as used herein, may include, but is not limited to, a software or hardware component, such as a Field Programmable Gate Array (FPGA) or Application Specific Integrated Circuit (ASIC), which performs certain tasks. A unit may be configured to reside on the addressable storage medium and configured to execute on one or more processors. Thus, a unit may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and units may be combined into fewer components and units or further separated into additional components and units. In addition, the components and units may be implemented such that they execute one or more computers in a communication system.

Figure 1:
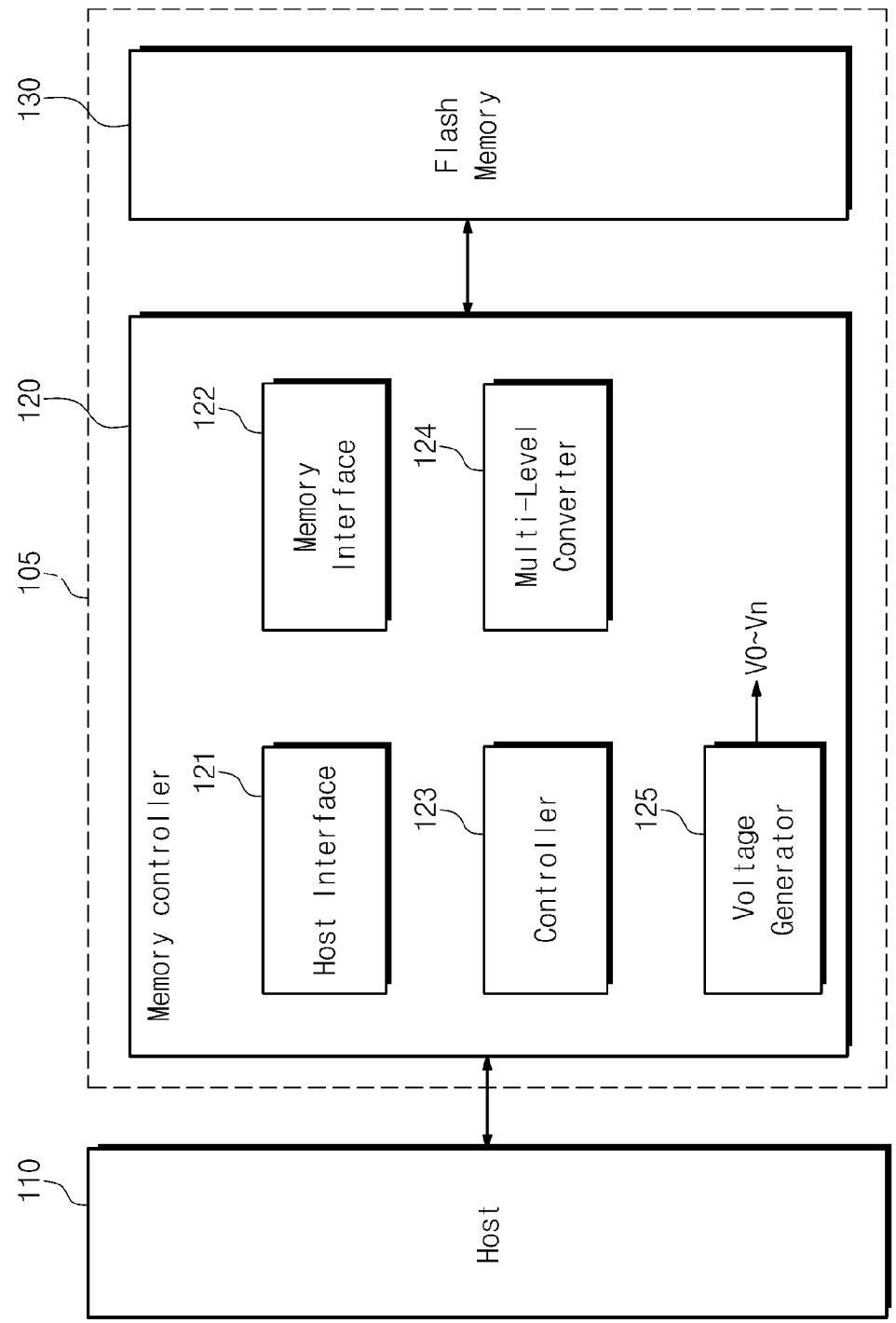
FIG. 1 is a block diagram of a memory system according to an exemplary embodiment.

FIG. 1 is a block diagram of a memory system according to an exemplary embodiment of the present invention. The memory system may be constituted by a host 110, a memory controller 120 and a flash memory 130. In an alternative exemplary embodiment, the memory controller 120 and the flash memory 130 may be separate devices.

Referring to FIG. 1, a memory device 105 includes a memory controller 120 and a flash memory 130. The flash memory 130 operates under the control of the memory controller 120. The flash memory 130 can be a nonvolatile memory such as a Not AND (NAND) flash memory, a Not OR (NOR) flash memory, a phase-change random access memory (PRAM), a magnetic RAM (MRAM), or the like.

The memory controller 120 operates to control the flash memory 130 in response to a request from a host 110. The memory controller 120 includes a host interface 121, a memory interface 122, a controller 123, a multi-level converter 124, and a voltage generator 125. The host interface 121 is configured to interface with the host 110, and the memory interface 122 is configured to interface with the flash memory 130. The controller 123 includes a processor for controlling an overall operation of the memory controller 120. If the memory device 105 including the memory controller 120 and the flash memory 130 is embedded in the host 110, the memory controller 120 can be directly connected to the host 110. The memory device 105 including the memory controller 120 and the flash memory 130 may be a kind of memory card, e.g., a flash memory card, a smart card, a Secure Digital (SD) card, a MultiMedia card (MMC), or the like.

The voltage generator 125 operates to generate a plurality of voltages V0 to Vn. The multi-level converter 124 receives data signals, which are to be transferred to the flash memory 130 from the memory interface, generates multi-level voltage signals based on the received data signals, and outputs the multi-level voltage signals. In other words, the multi-level converter 124 outputs a voltage, corresponding to plural bits of a data signal to be transferred to the flash memory 130, among the plural voltages V0 to Vn, as a multi-level voltage signal. The multi-level converter 124 also restores multi-level voltage signals, which are received from the flash memory 130, to data signals. That is, the multi-level converter 124 restores multi-level voltage signals, which are read from the flash memory 130, to their original data signals each having plural bits and provides the restored data signals to the memory interface 122.

The multi-level converter 124 may further comprise a function of converting signals between the host 110 and the host interface 121. In detail, the multi-level converter 124 receives data signals, which are to be transferred to the host 130, from the host interface 121, generates multi-level voltage signals based on the received data signals, outputs the multi-level voltage signals to be provided to the host, and restores multi-level voltage signals, which are received from the host 110, to data signals.

FIG. 2A shows an example where data signals are converted into multi-level voltage signals by the multi-level converter 124 of FIG. 1, and FIG. 2B shows an example where multi-level voltage signals are converted into data signals by the multi-level converter of FIG. 1.

Referring to FIG. 2A, the multi-level converter 124 receives a data signal, which is to be transferred to the flash memory 130, from the memory interface 122, generates a multi-level voltage signal based on the received data signal, in the unit of two (2) bits, and outputs the multi-level voltage signal. In this case, voltages V0 to V3 supplied from the voltage generator 125 are 0V, 1.5V, 1.8V, and 3.3V, respectively. For instance, if a data signal is '00', a voltage level of its corresponding multi-level voltage signal is 0V. If a data signal is '01', a voltage level of its corresponding multi-level voltage signal is 1.5V. If a data signal is '10', a voltage level of its corresponding multi-level voltage signal is 1.8V. And if a data signal is '11', it is converted into a multi-level voltage signal of 3.3V. The voltages 0V, 1.5V, 1.8V, and 3.3V are supplied from the voltage generator 125. According to this case, a data transfer rate from the memory controller 120 to the flash memory 130 is doubled as further described with respect to FIGS. 8A and 8B.

Referring to FIG. 2B, the multi-level converter 124 detects a voltage level of a multi-level voltage signal received from the flash memory 122 and generates a two (2)-bit data signal in accordance with the detected voltage level. For example, if a multi-level voltage signal is higher than 0V but lower than 0.8V, it is converted into a data signal of '00'. If a multi-level voltage signal is equal to or higher than 0.8V but lower than 1.7V, it is converted into a data signal of '01'. If a multi-level voltage signal is equal to or higher than 1.7V but lower than 2.5V, it is converted into a data signal of '10'. If a multi-level voltage signal is equal to or higher than 2.5V but lower than 3.3V, it is converted into a data signal of '11'. According to this case, a data transfer rate from the memory controller 120 to the flash memory 130 is doubled as further described with respect to FIGS. 8A and 8B.

As described above, the multi-level converter 124 is described using an exemplary embodiment in which there are data signals and multi-level voltage signals exchanged between the memory interface 122 and the flash memory 130. But, the multi-level converter 124 is able to also operate for exchanging data signals and multi-level voltage signals between the host interface 121 and the host 110 as similar thereto, enhancing a data transfer rate between the host 110 and the memory controller 120.

The voltages 0V and 3.3V, among the voltages 0V, 1.5V, 1.8V, and 3.3V, output from the voltage generator 125, are supplied from the host 110. The voltages 1.5V and 1.8V are used for conducting basic operations of the memory controller 120 and the flash memory 130. Therefore, it is unnecessary to additionally generate a voltage for an operation of the multi-level converter 124 via the voltage generator 125.

Figure 3:
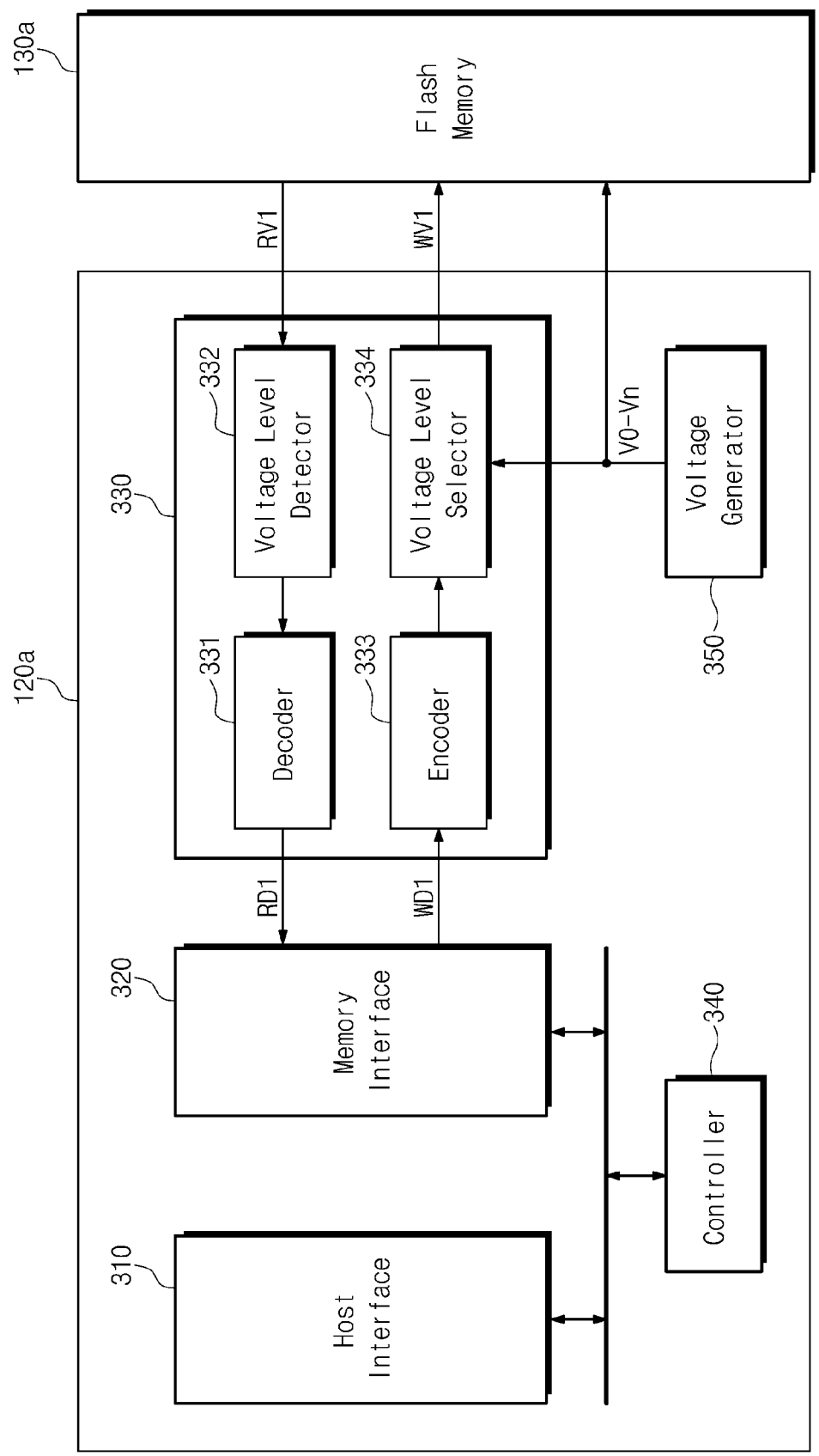
FIG. 3 is a block diagram of the memory controller shown in FIG. 1 in accordance with an exemplary embodiment.

FIG. 3 is a block diagram of another exemplary embodiment of the memory controller 120 shown in FIG. 1 which is shown in FIG. 3 as a memory controller 120a.

Referring to FIG. 3, the memory controller 120a includes a host interface 310, a memory interface 320, a multi-level converter 330, a controller 340, and a voltage generator 350.

The multi-level converter 330 is connected to the memory interface 320 and communicates with the flash memory 130a. The multi-level converter 330 includes a decoder 331, a voltage level detector 332, an encoder 333, and a voltage level selector 334. Signals transferred between the multi-level converter 330 and the flash memory 130a include a writing voltage signal WV1 and a reading voltage signal RV1 which are multi-level voltage signals. The reading voltage signal RV1 is a multi-level voltage signal to be transferred to the memory controller 120a from the flash memory 130a. The writing voltage signal WV1 is a multi-level voltage signal which is output from the memory controller 120a and is to be transferred to the flash memory 130a.

The voltage level detector 332 senses a voltage level of the reading voltage signal RV1 output from the flash memory 130a. The decoder 331 provides a reading data signal RD1 to the memory interface 320 in accordance with the voltage level sensed by the voltage level detector 332. The encoder 333 operates to encode a writing data signal WD1, which is output from the memory interface 320, into a parallel data signal having plural bits. The voltage generator 350 operates to generate a plurality of voltages V0 to Vn. The voltage level selector 334 operates to select one, corresponding to the parallel data signal provided from the encoder 333, from the plural voltages V0 to Vn and outputs the selected voltage as the writing voltage signal WV1.

FIG. 8A shows an example where the writing data signal WD1 is converted into the writing voltage signal WV1 by the multi-level converter 330 of FIG. 3.

Referring to FIG. 8A, the multi-level converter 330 receives the writing data signal WD1, generates the writing voltage signal WV1 based on two (2) bits of the writing data signal WD1. A voltage level of the writing voltage signal WV1 is variable in accordance with levels of the voltages V0 to Vn provided from the voltage generator 350 shown in FIG. 3. The multi-level converter 330 can be also configured to generate the writing voltage signal WV1 based on the writing data signal WD1 based on four (4) or eight (8) bits instead of two (2) bits.

FIG. 8B shows an example where the writing data signal WD1 output from the memory interface 320 shown in FIG. 3 is transferred directly to the flash memory 130a without converting into a multi-level voltage signal.

It is understood from FIGS. 8A and 8B that the multi-level converter 330 contributes to doubling a data transfer rate of data transmitted from the memory controller 120a toward the flash memory 130a.

Figure 4:
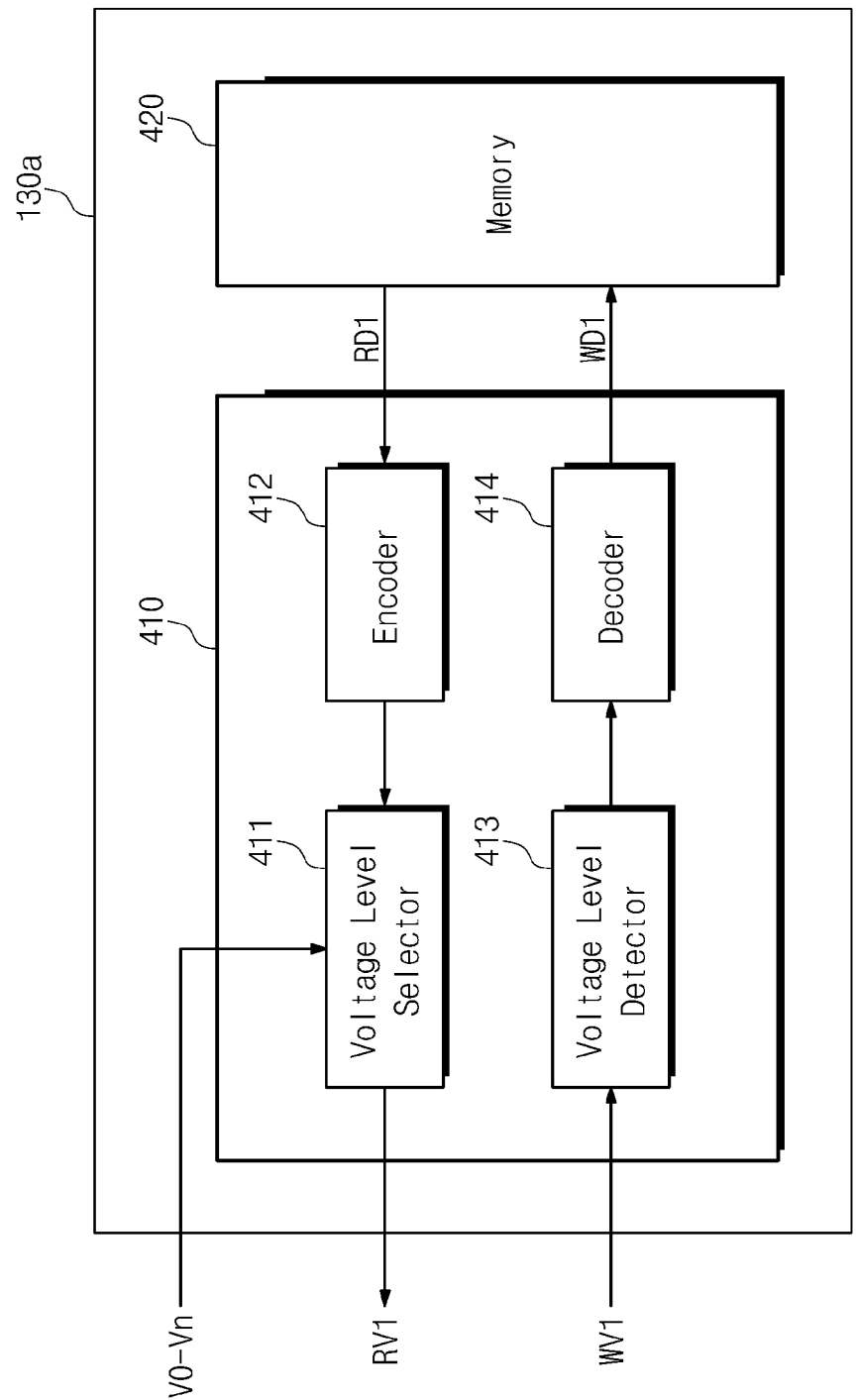
FIG. 4 is a block diagram of the flash memory connected to the memory controller in FIG. 3, according to exemplary embodiment.

FIG. 4 is a block diagram of the flash memory 130a connected to the memory controller 120a shown in FIG. 3, according to an exemplary embodiment.

Referring to FIG. 4, the flash memory 130a includes a multi-level converter 410 and a memory 420. The multi-level converter 410 includes a voltage level selector 411, an encoder 412, a voltage level detector 413, and a decoder 414.

The voltage level selector 411, the encoder 412, the voltage level detector 413, and the decoder 414 of the multi-level converter 410 operate in a similar manner as the voltage level selector 334, the encoder 333, the voltage level detector 332, and the decoder 331 shown in FIG. 3, so additional explanation of those elements will not be provided.

The memory 420 includes a memory cell array (not shown) and peripheral circuits (not shown). Data read from the memory 420 is output as the reading voltage signal RV1 by the multi-level converter 410 and the reading voltage signal RV1 is provided to the memory controller 120a of FIG 3. The writing voltage signal WV1 input from the memory controller 120a of FIG. 3 is output as a writing data signal WD1 of plural bits by the multi-level converter 410 and the writing data signal WD1 is written into the memory 420.

The memory controller 120a and the flash memory 130a, so configured as aforementioned, are helpful to improving operation performance of a memory card with the flash memory 130a.

Figure 5:
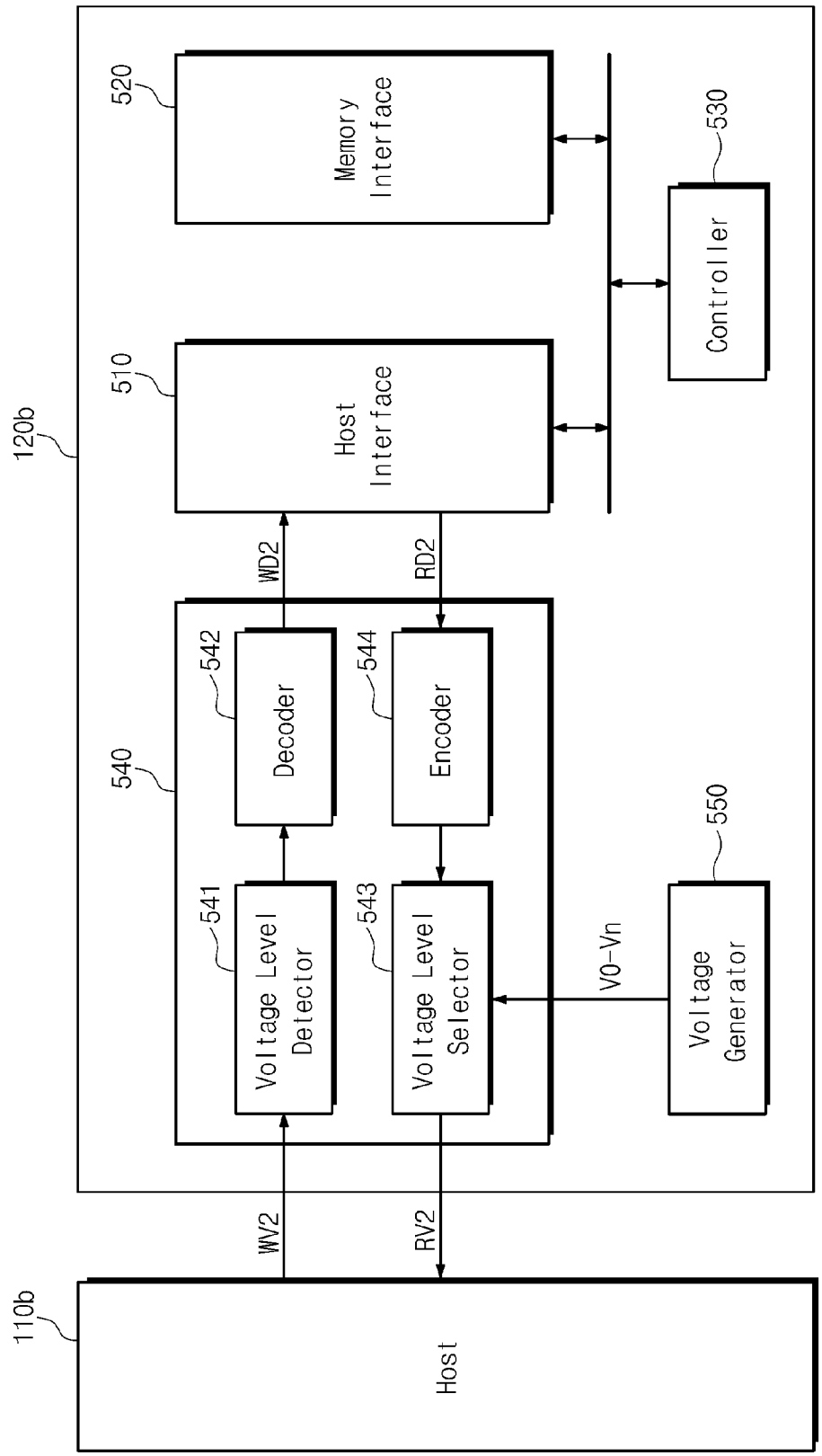
FIG. 5 is a block diagram of a memory controller according to another exemplary embodiment.

FIG. 5 is a block diagram of a memory controller according to another exemplary embodiment of the present invention.

Referring to FIG. 5, the memory controller 120a includes a multi-level converter 540, a host interface 510, a memory interface 520, a controller 530, and a voltage generator 550. In this exemplary embodiment, the multi-level converter 540 is interposed between the host 110b and the host interface 510 and is connected to the host interface 510.

The multi-level converter 540 includes a voltage level detector 541, a decoder 542, a voltage level selector 543, and an encoder 544. Signals transferred between the host 110b and the multi-level converter 540 are a writing voltage signal WV2 and a reading voltage signal RV2, which are multi-level voltage signals.

The voltage level detector 541 senses a voltage level of the writing voltage signal WV2 transferred from the host 110b. The decoder 542 provides the writing data signal WD2 to the host interface 510 in accordance with a voltage level sensed by the voltage level detector 542. The encoder 544 operates to encode a reading data signal RD2, which is output from the host interface 510, into a parallel data signal of plural bits. The voltage generator 550 operates to generate a plurality of voltages V0 to Vn. The voltage level selector 543 outputs a reading voltage signal RV2 by selecting one of the plural voltages V0 to Vn in accordance with the parallel data signal output from the encoder 544.

Figure 6:
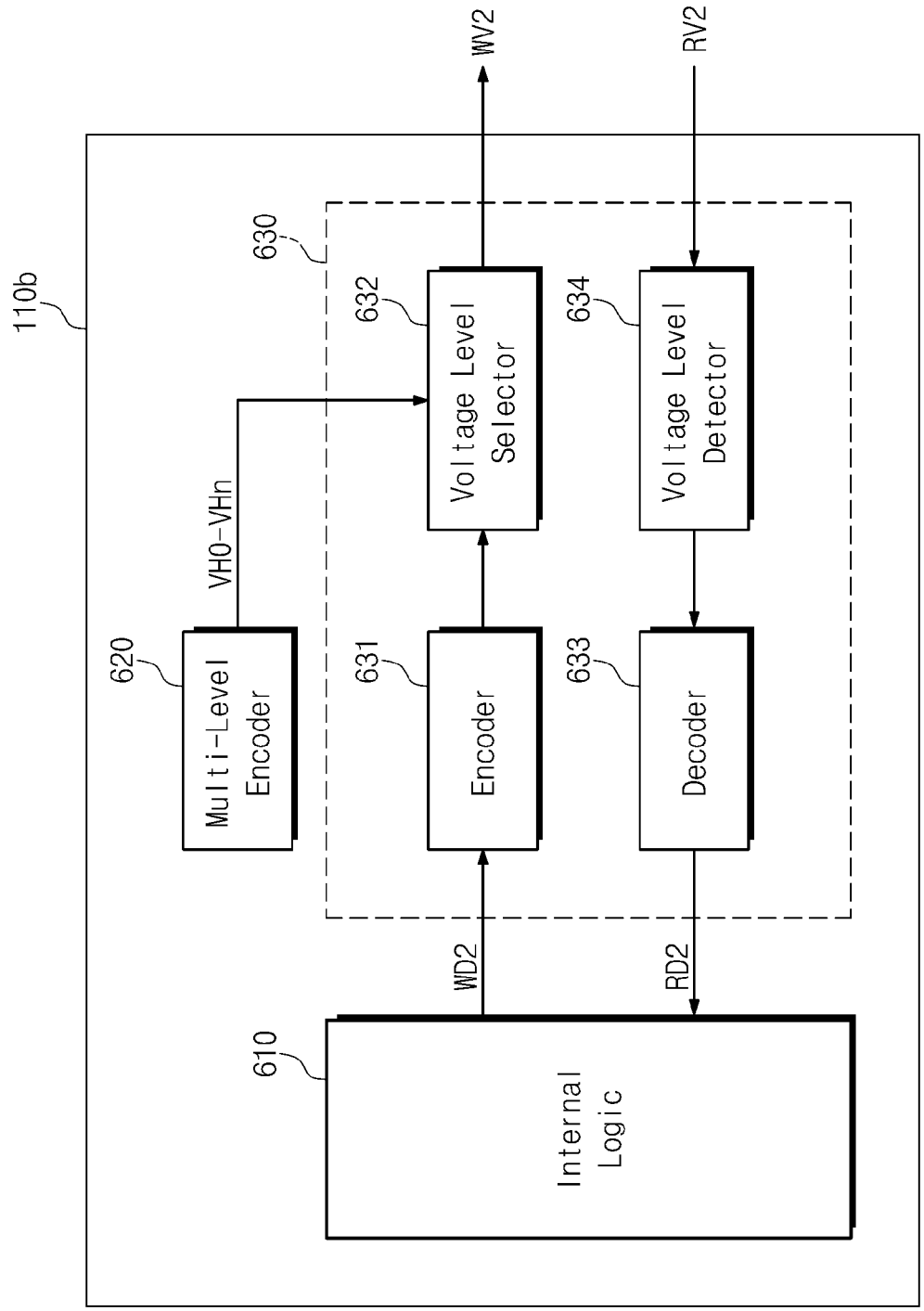
FIG. 6 is a block diagram of the host connected to the memory controller in FIG. 5, according to exemplary embodiment.

FIG. 6 is a block diagram of the host 110b connected to the memory controller 120b shown in FIG. 5, according an exemplary embodiment.

Referring to FIG. 6, the host 110b includes an internal logic circuit 610, a voltage generator 620, and a multi-level converter 630. The multi-level converter 630 includes an encoder 631, a voltage level selector 632, a decoder 633, and a voltage level detector 634.

The encoder 631, the voltage level selector 632, the decoder 633, and the voltage level detector 634 of the multi-level converter 630 operate in a similar manner as the encoder 544, the voltage level selector 543, the decoder 542, and the voltage level detector 541 shown in FIG. 5, so these features will not be further described.

Data provided from the internal logic circuit 610 is output as the writing voltage signal WV2 through the multi-level converter 630 and the writing voltage signal WV2 is provided to the memory controller 120b. The reading voltage signal RV2 input from the memory controller 120b is output as the reading data signal RD2 of plural bits through the multi-level converter 610 and the reading data signal RD2 is transferred to the internal logic circuit 610.

The host 110b and the memory controller 120b, so configured as aforementioned, are helpful to improving operation performance of a memory card with the flash memory 130a.

Figure 7A:
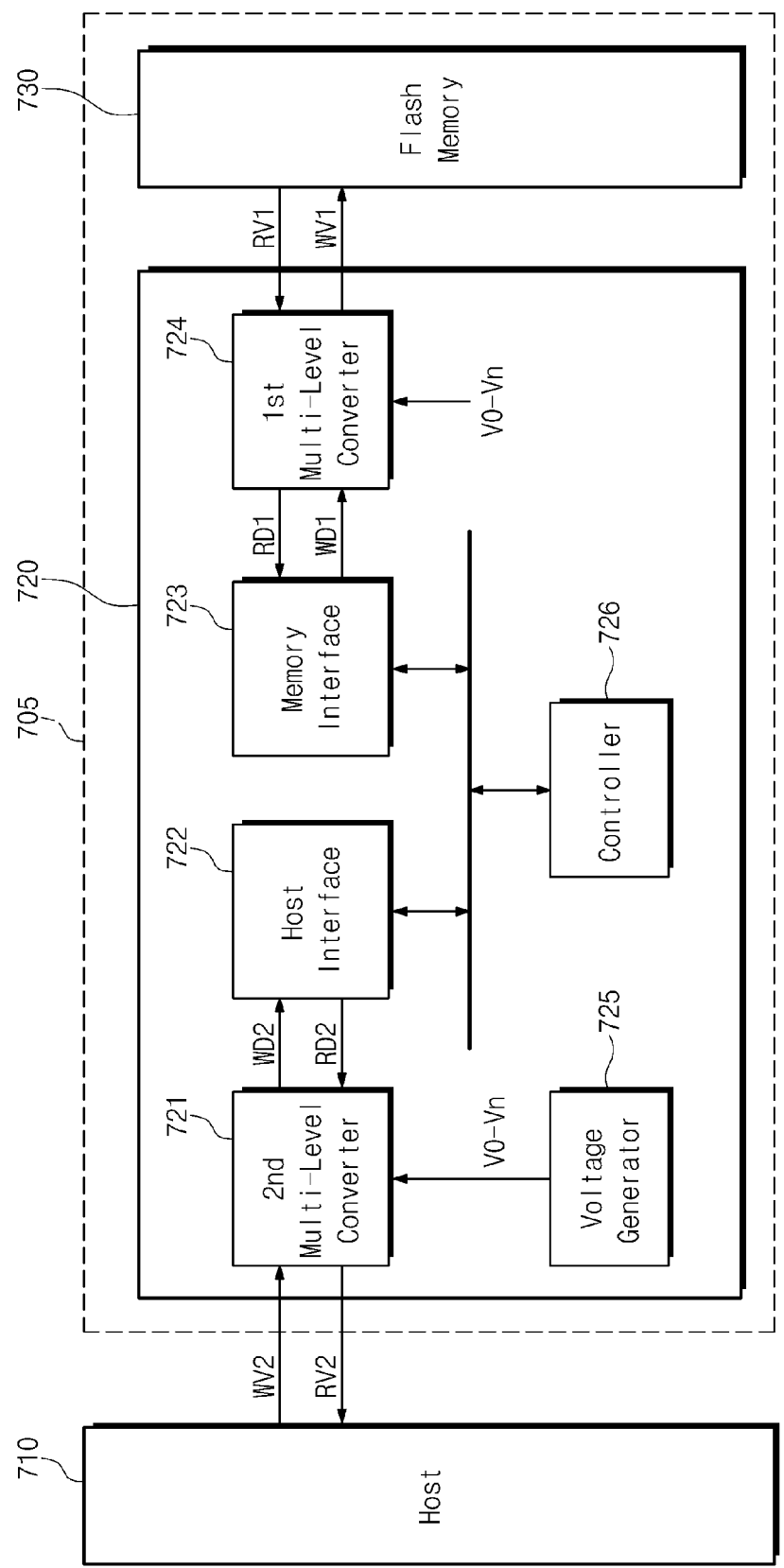
FIG. 7A is a block diagram of a memory system according to still another exemplary embodiment.

FIG. 7A is a block diagram of a memory system according to still another exemplary embodiment.

Referring to FIG. 7A, the memory system includes a host 710 and a memory device 705 that includes a memory controller 720, and a flash memory 730.

The memory controller 720 includes first and second voltage signal converters 724 and 721, a host interface 722, a memory interface 723, a voltage generator 725, and a controller 726.

The first multi-level converter 724 is connected between the memory interface 723 and the flash memory 730. The first multi-level converter 724 receives the writing data signal WD1, which is output from the memory interface 723, generates the writing voltage signal WV1 based on the received writing data signal WD1, and the writing voltage signal WV1 is provided to the flash memory 730. The first multi-level converter 724 also receives the reading voltage signal RV1, which is output from the flash memory 730, generates the reading data signal RD1 based on the received reading voltage signal RV1, and the reading data signal RD1 is provided to the memory interface 723.

The second multi-level converter 721 is connected between the host 710 and the host interface 722. The second multi-level converter 721 receives the writing voltage signal WV2, which is output from the host 710, and generates the writing data signal WD2 based on the writing voltage signal WV2, and the writing data signal WD2 is provided to the host interface 722. The second multi-level converter 721 also receives the reading data signal RD2, which is output from the host interface 722, and generates the reading voltage signal RV2 based on the reading data signal RD2, and the reading voltage signal RV2 is provided to the host 710. The voltage signals transferred between the memory controller 720 and the flash memory 730 and/or between the host 710 and the memory controller 720 are multi-level voltage signals.

According to still another exemplary embodiment, in the memory system 700 of FIG. 7A, the reading data signal RD1 input to the memory interface 723 may be the same as the reading data signal RD2 output from the host interface 722, and the writing data signal WD1 output from the memory interface 723 may be the same as the writing data signal WD2 input to the host interface 722.

Figure 7B:
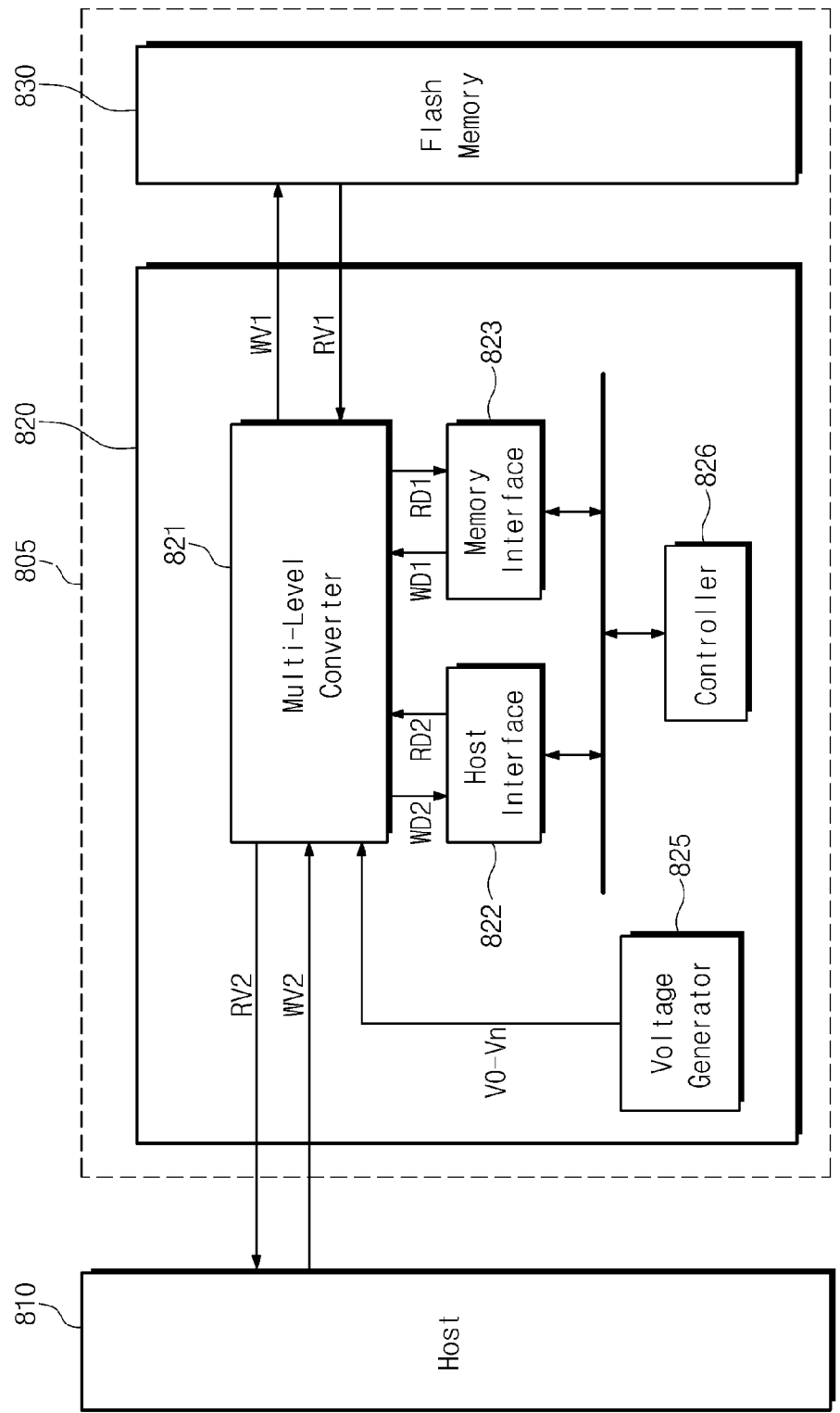
FIG. 7B is a block diagram of a memory system, different from FIG. 7A, according to still another exemplary embodiment.

FIG. 7B is a block diagram of a memory system according to still another exemplary embodiment.

The memory system illustrated in FIG. 7B differs from that of FIG. 7A in that a memory controller 820 is configured to have one multi-level converter 821 instead of two multi-level converters 721 and 724. Other elements of the memory system in FIG. 7B such as a host 810, a flash memory 830, a host interface 822, a memory interface 823, a voltage generator 825 and a controller 826 perform the same functions as the corresponding elements in the memory system illustrated in FIG. 7A.

The multi-level converter 821 is connected to both the host interface 822 and the memory interface 823. The multi-level converter 821 is also connected to both the host 810 and the flash memory 830. That is, when the memory device 805 is connected to the host 810, both the host 810 and the flash memory 830 shares the same multi-level converter 821 for generating data signals from corresponding voltage signals and generating voltage signals from corresponding data signals.

More specifically, the multi-level converter 821 receives a writing voltage signal WV2 from the host 810, generates a writing data signal WD2 based on the writing voltage signal WV2, and outputs the writing data signal WD2 to the host interface 822. The multi-level converter 821 also receives a writing data signal WD1 from the memory interface 823, generates a writing voltage signal WV1 based on the writing data signal WD1, and outputs the writing voltage signal WV1 to the flash memory 830. The multi-level converter 821 also receives a reading voltage signal RV1 from the flash memory 830, generates a reading data signal RD1 based on the reading voltage signal RV, and outputs the reading data signal RD1 to the memory interface 823. The multi-level converter 821 also receives a reading data signal RD2 from the host interface 822, generates a reading voltage signal RV2 based on the reading data signal RD2, and outputs the reading voltage signal RV2 to the host 810. The voltage signals transferred between the memory controller 820 and the flash memory 830 and/or between the host 810 and the memory controller 820 are multi-level voltage signals. In this exemplary embodiment, if a signal conflict occurs between the reading voltage signal RV1 and the writing voltage signal WV2 at the multi-level converter 821, the multi-level converter may determine which voltage signal is first processed to generate a corresponding data signal based on given priority. For example, when a writing operation is performed, the writing voltage signal WV2 has priority over the reading voltage signal RV1, and when a reading operation is performed, the reading voltage signal RV1 has priority over the writing voltage signal WV2.

Figure 9:
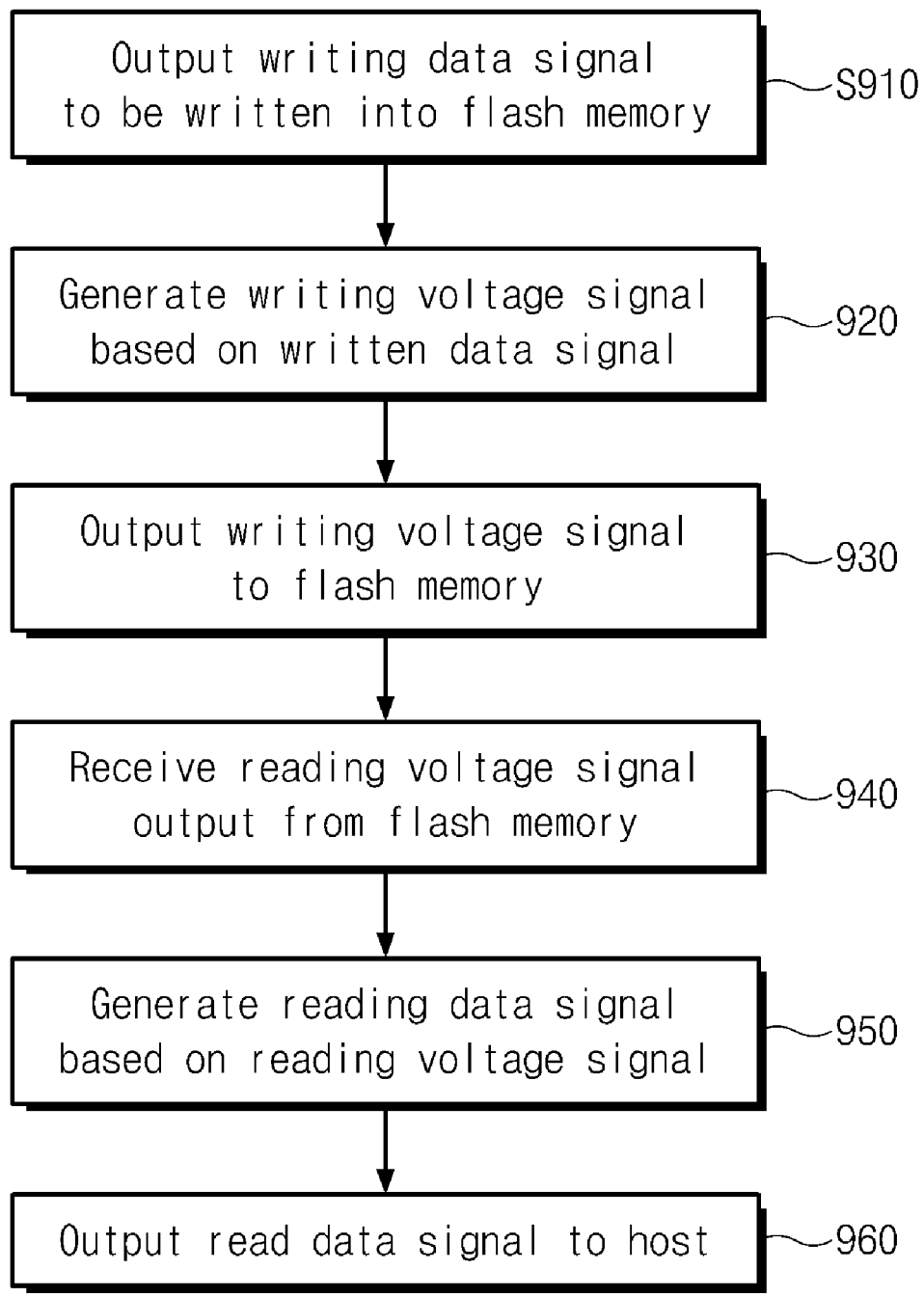
FIG. 9 is a flowchart illustrating a method of controlling a flash memory using a host and a memory controller, according to an exemplary embodiment.

FIG. 9 is a flowchart that illustrates a method of controlling a flash memory using a host and a memory controller, according to an exemplary embodiment. In S910, the host 810 outputs a writing data signal to be written into the flash memory 830. Based on this writing data signal, a writing voltage signal is generated in S920 and output to the flash memory 830 (S930). Next, the flash memory 830 outputs a reading voltage signal (S940), based on which a reading data signal is generated in S950. This reading data signal is output to the host 810 in S960. Here, the writing voltage signal is selected from plural voltages in accordance with plural bits of the writing data signal, and the voltage of the reading voltage signal corresponds to one of $2^n$ voltage ranges, where n is equal to or greater than two (2), and each of the $2^n$ ranges represents corresponding data having plural bits.

According to the memory system according to the exemplary embodiments explained above, more data signals can be transferred between the host and the memory controller and/or between the memory controller and the flash memory in a given time, compared to a related art. Thus, the performance of the memory system can be improved according to the increased data transfer rate.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A memory card comprising:
   a flash memory;
   a memory interface that outputs a first writing data signal to be written into the flash memory;
   a first multi-level converter that generates a first writing voltage signal based on the first writing data signal, and outputs the first writing voltage signal to be provided to the flash memory,
   wherein, to generate the first writing voltage signal, the first multi-level converter selects a voltage of the first writing voltage signal from a plurality of voltages in accordance with a plurality of bits of the first writing data signal;
a host interface that outputs a second reading data signal to be transferred to a host; and
a second multi-level converter that receives the second reading data signal, and generates a second reading voltage signal to be provided to the host based on the second reading data signal,
wherein a voltage of the second reading voltage signal is selected from the plurality of voltages in accordance with a plurality of bits of the second reading data signal, and
wherein the second multi-level converter receives a second writing voltage signal from the host, generates a second writing data signal in the unit of a plurality of bits based on the second writing voltage signal, and outputs the second writing data signal to be provided to the host interface.

2. The memory card of claim 1, wherein the multi-level converter receives a first reading voltage signal output from the flash memory, and generates a first reading data signal in a unit of plural bits based on the reading voltage signal which is provided to the memory interface.

3. The memory card of claim 1, further comprising a voltage generator that generates the plurality of voltages,
wherein the first multi-level converter comprises:
an encoder that encodes the first writing data signal in the unit of a plurality of bits to output an encoded signal;
a voltage selector that selects one of the plurality of voltages, corresponding to the encoded signal output from the encoder, as the first writing voltage signal, and provides the first writing voltage signal to the flash memory;
a voltage detector that detects a voltage of the first reading voltage signal; and
a decoder that generates the first reading data signal in the unit of a plurality of bits according to the detected voltage, to provide the first reading data signal to the memory interface.

4. The memory card of claim 3, wherein the unit of plurality of bits, in which the encoder encodes the first writing data signal, is n bits where n is equal to or greater than two (2), and
wherein the plurality of voltages generated from the voltage generator are $2^n$ voltages.

5. The memory card of claim 3, wherein the detected voltage of the first reading voltage signal output from the flash memory corresponds to one of $2^n$ voltage ranges where n is equal to or greater than two (2), each of the $2^n$ ranges representing corresponding data having a plurality of bits.

6. The memory card of claim 1, wherein the flash memory comprises:
a memory circuit; and
a converter that receives the first writing voltage signal output from the first multi-level converter, generates a memory input data signal of a plurality of bits to be written to the memory circuit based on the first writing voltage signal, receives a memory output data signal read from the memory circuit, and generates the first reading voltage signal based on the memory output data signal which is to be provided to the multi-level converter,
wherein a voltage of the first reading voltage signal corresponds to one of $2^n$ voltage ranges where n is equal to or greater than two (2), according to a plurality of bits of the memory output data signal, each of the $2^n$ ranges representing corresponding data having a plurality of bits.

7. The memory card of claim 1, wherein the first multi-level converter receives a first reading voltage signal output from the flash memory, generates a first reading data signal in the unit of plural bits based on the first reading voltage signal, and outputs the first reading data signal to be provided to the memory interface.

8. The memory card of claim 1, wherein the second reading data signal is the first reading data signal which is output from the first multi-level converter and provided to the memory interface, and
wherein the second writing data signal is the first writing data signal which is output from the memory interface and provided to the first multi-level converter.

9. The memory card of claim 1, further comprising a voltage generator that generates the plural voltages,
wherein the first multi-level converter comprises:
a first encoder that encodes the first writing data signal in the unit of a plurality of bits to output a first encoded signal;
a first voltage selector that selects one of the plurality of voltages, corresponding to the first encoded signal output from the first encoder, as the first writing voltage signal, and provides the first writing voltage signal to the flash memory;
a first voltage detector that detects a voltage of the first reading voltage signal; and
a first decoder that generates the first reading data signal of the plurality of bits, according to the detected voltage, to provide the first reading data signal to the memory interface, and
wherein the second multi-level converter comprises:
a second encoder that encodes the second reading data signal in the unit of a plurality of bits to output a second encoded signal;
a second voltage selector that selects one of the plurality of voltages, corresponding to the second encoded signal output from the second encoder, as the second reading voltage signal to be provided to the host;
a second voltage detector that detects a voltage of the second writing voltage signal; and
a second decoder that generates the second writing data signal of the plurality of bits, according to the detected voltage, to provide the second writing data signal to the host interface.

10. The memory card of claim 1, wherein the flash memory comprises:
a memory circuit; and
a converter that receives the first writing voltage signal output from the first multi-level converter, generates a memory input data signal of a plurality of bits to be written to the memory circuit based on the first writing voltage signal, receives a memory output data signal read from the memory circuit, generates the first reading voltage signal based on the memory output data signal, and outputs the first reading voltage signal to be provided to the first multi-level converter,
wherein a voltage of the first reading voltage signal corresponds to one of $2^n$ voltage ranges where n is equal to or greater than two (2), according to a plurality of bits of the memory output data signal, each of the $2^n$ ranges representing corresponding data having a plurality of bits.

11. A memory system comprising:
a host; and
the memory connected to the host,
wherein the memory comprises:
a flash memory;
a memory interface that outputs a writing data signal to be written into the flash memory; and a multi-level converter that generates a writing voltage signal based on the writing data signal, and outputs the writing voltage signal to be provided to the flash memory,
wherein, to generate the writing voltage signal, the multi-level converter selects a voltage of the writing voltage signal from a plurality of voltages in accordance with a plurality of bits of the writing data signal,
wherein the multi-level converter is a first multi-level converter, the writing data signal is a first writing data signal, the writing voltage signal is a first writing voltage signal,
wherein the memory card further comprises:
a host interface that outputs a second reading data signal to be transferred to a host; and
a second multi-level converter that receives the second reading data signal, and generates a second reading voltage signal to be provided to the host based on the second reading data signal,
wherein a voltage of the second reading voltage signal is selected from the plurality of voltages in accordance with a plurality of bits of the second reading data signal, and
wherein the host interface outputs the second reading data signal to be transferred to the host, and the second reading voltage signal is provided to the host.

12. The memory system of claim 11, wherein the host restores the second reading voltage signal from the second multi-level converter into a host input data signal of a plurality of bits to be provided to the host, outputs a host output data signal, generates the second writing voltage signal based on the host output data signal, and output the second writing voltage signal which is to be provided to the second multi-level converter,
wherein a voltage of the second writing voltage signal is selected from the plurality of voltages according to a plurality of bits of the host output data signal.

13. The memory system of claim 11, wherein two voltages of the plural voltages are supplied from the host to the voltage generator.

14. A method of controlling a flash memory using a host and a memory controller, the method comprising:
outputting a writing data signal to be written into the flash memory;
generating a writing voltage signal based on the writing data signal, and outputting the writing voltage signal to the flash memory;
receiving a reading voltage signal output from the flash memory;
generating a reading data signal based on the reading voltage signal, and outputting the reading data signal to the host,
wherein the writing voltage signal is selected from a plurality of voltages in accordance with plural bits of the writing data signal,
wherein the voltage of the reading voltage signal corresponds to one of $2^n$ voltage ranges where n is equal to or greater than two (2), each of the $2^n$ ranges representing corresponding data having plural bits, and
wherein the plurality of voltages do not include other than two voltages supplied from the host, and two voltages which are operational voltages of the flash memory.

15. The method of claim 14, wherein two voltages of the more than two voltages are supplied from the host to the voltage generator.

16. A memory card comprising:
a flash memory;
a voltage generator that generates a plurality of voltages;
a memory interface that outputs a writing data signal to be written into the flash memory, the writing data signal being input from a host; and
a multi-level converter that generates a writing voltage signal based on the writing data signal, and outputs the writing voltage signal to be provided to the flash memory,
wherein, to generate the writing voltage signal, the multi-level converter selects a voltage of the writing voltage signal from the plurality of voltages generated at the voltage generator in accordance with a plurality of bits of the writing data signal, and
wherein the plurality of voltages do not include other than two voltages supplied from the host, and two voltages which are operational voltages of the flash memory.

* * * * *